United States Patent [19]
Lowrey

[11] Patent Number: 5,332,682
[45] Date of Patent: Jul. 26, 1994

[54] LOCAL ENCROACHMENT REDUCTION

[75] Inventor: Tyler A. Lowrey, Boise, Id.

[73] Assignee: Micron Semiconductor, Inc., Boise, Id.

[21] Appl. No.: 55,416

[22] Filed: Apr. 30, 1993

Related U.S. Application Data

[63] Continuation of Ser. No. 861,344, Mar. 30, 1992, abandoned, which is a continuation-in-part of Ser. No. 571,557, Aug. 31, 1990, abandoned.

[51] Int. Cl.$^5$ .......................................... H01L 21/265
[52] U.S. Cl. .................................... 437/28; 437/47; 437/48; 437/52; 437/69
[58] Field of Search .................. 437/28, 29, 30, 47, 437/48, 52, 63, 69, 70; 357/23.6

[56] References Cited

U.S. PATENT DOCUMENTS

| | | | |
|---|---|---|---|
| 4,240,092 | 12/1980 | Kuo | 437/52 |
| 4,352,236 | 10/1982 | McCollum | 437/70 |
| 4,366,613 | 1/1983 | Ogura et al. | 437/30 |
| 4,414,058 | 11/1983 | Mueller | 437/27 |
| 4,507,159 | 3/1985 | Erb | 437/48 |
| 4,612,565 | 9/1986 | Shimizu et al. | 357/65 |
| 4,686,552 | 8/1987 | Teng et al. | 357/51 |
| 4,702,797 | 10/1987 | Shimano et al. | 437/52 |
| 4,883,543 | 11/1989 | Gossen, Jr. et al. | 437/52 |
| 4,945,066 | 7/1990 | Kang et al. | 437/30 |
| 4,959,325 | 9/1990 | Lee et al. | 437/30 |
| 4,997,774 | 3/1991 | Kim | 437/52 |

Primary Examiner—R. Bruce Breneman
Assistant Examiner—Ourmazd S. Ojan
Attorney, Agent, or Firm—Stanley N. Protigal

[57] ABSTRACT

Local Encroachment Reduction (LER) is described, in which a fraction of field oxide is selectively etched. A high energy boron implant is used to maintain adequate active area isolation after the removal. This implant also doubles as a LER high capacitance and provides a carrier to minority substrate electrons. After the high energy boron implant, an N-type bottom plate capacitor is implanted. At that point, the wafer is completed by existing techniques.

20 Claims, 4 Drawing Sheets

Periphery | Memory

LOCAL ENCROACHMENT REDUCTION

This application is a continuation of application Ser. No. 07/861,344, filed Mar. 30, 1992, now abandoned, which in turn is a continuation of application Ser. No. 07/571,557, filed Aug. 31, 1990, now abandoned.

FIELD OF THE INVENTION

This invention relates to fabrication of semiconductor circuit devices and more particularly to techniques for reducing encroachment of field oxide into active area of a semiconductor array during the growth of field oxide. The invention has particular utility in memory arrays such as dynamic random access memories (DRAMs).

BACKGROUND OF THE INVENTION

This invention relates to the manufacture of semiconductor circuit devices. More specifically the invention relates to manufacture of multilayer semiconductor circuit devices in which photomasking steps are used in the manufacture.

The invention uses various materials which are electrically either conductive, insulating or semiconducting, although the completed semiconductor circuit device itself is usually referred to as a "semiconductor". One of the materials used is silicon, which appears as either single crystal silicon or as polycrystalline silicon material, referred to as polysilicon or "poly" in this disclosure.

This invention describes a technique to maximize cell capacitor area in a high density/high volume DRAM (dynamic random access memory) fabrication process. It is called "local encroachment reduction" or "LER" for short. The invention is applicable to all high density DRAM planar processes from the 16 Kbit to the 4 Megbit generations and beyond.

It is well known for high density DRAM process/cell design, that maximum cell capacitor active area must be obtained as a percentage of repeating geometry area in a DRAM array. This active region/repeating region ratio determines the overall die size for a given feature size capability. This then translates directly into cost per bit. The active capacitor region must be large enough to insure proper sensing of data by the bitline sense amps and to insure strong immunity to single event upsets such as alpha particles.

One key factor in maximizing cell capacitor active area is in reducing field oxide encroachment into active area during field oxidation. Encroachment can cause a loss of active width up to twice the field ox thickness. As geometries shrink in more advanced generation DRAMs, this effect becomes a dominant factor. A common method of approaching this problem involves use of some sort of field oxidation encroachment reduction technique. Several techniques are discussed in the literature including SWAMI, SILO, BOX, Poly Buffer, Nitrox, trench isolation, and others. Each has their advantages and disadvantages, but all involve adding a great deal of added complexity to the process.

Some prior art processes result in undue crystal stress leading to junction leakage to levels intolerable on DRAM circuits. Others result in large angle abrupt profiles (or even re-entrant profiles in some cases), making anisotropic etch of subsequent thin films difficult. Prior art proposed solutions require a gate oxide strip and regrow (or double strip and regrow) to form the final gate oxide. This has a disadvantage of thinning the field isolation oxide and adds extra process steps. Some of the other methods involve a Si etch into Si substrate, which requires extra precaution during subsequent process steps to avoid generation of stacking faults and other crystal defects.

Other encroachment reduction schemes are more susceptible to isolation leakage due to the reduction in the active area N+ space. Increasing the standard field implant has other performance degradation implications and is therefore not desirable. These degradations include increased N+ junction capacitance and aggravated transistor narrow W effects. The LER approach embodied here suffers from none of the above limitations.

The purpose of this invention is to describe a simple yet extremely effective means of increasing cell capacitor area in an advanced DRAM process called "local encroachment reduction" or "LER". It involves reducing the encroachment of the field ox into the cell active area only locally in the cell active regions. It avoids all the pitfalls of prior art encroachment reduction schemes.

SUMMARY OF THE INVENTION

The invention utilizes photomasking to define only the regions where the capacitor active area is to be and all field ox isolation regions between cell capacitor active regions. A wet oxide etch is then timed to remove a pre-determined fraction of the field oxide present.

A high energy boron implant is used to maintain adequate active area isolation after the removal of a fraction of field oxide. This implant also doubles as a cell high capacitance implant for increasing the junction capacitance and provides a barrier to minority substrate electrons. The dose here is maximized but kept safely below the point of increasing junction leakage. The energy is optimized for penetration through the remaining field ox, while locating the active area peak distribution just below the junction depth of the subsequent N+ cell bottom plate formation.

After the high energy boron implant, resist is removed and an N-type bottom plate capacitor is implanted. This implant can be masked or blanket implanted depending on the application's specific process flow. The N-type bottom plate implant dose is high enough to significantly compensate the boron implant, thus insuring proper bottom plate junction formation.

At that point, the wafer is completed by existing techniques.

This process results in a dramatic decrease in the field isolation width obtainable, thus adding directly to the cell capacitor total active area.

The process maintains adequate cell poly parasitic device field threshold. The boron implant acts to increase the cell poly field threshold countering the effects of the field oxide thinning. The amount of oxide removal is set mainly by considerations of leakage from closely spaced N+ to N+ junctions and can typically be greater than 50% of the field ox thickness with guardband. Parasitic field device leakage is generally not a problem due to the raised threshold resulting from the boron implant.

The LER process requires only one extra wet etch step and perhaps a modification or addition of a boron implant masking step. Due to the isotropic nature of the wet HF etch, the resulting isolation oxide profile remains gentle, easing subsequent thin film photomasking and etch steps. With the LER process, a strip and regrow of the initial oxide from the local oxidation oxide/nitride stack is not necessary. This is because the LER process can be added (though not mandatory) to the process flow after transistor formation and prior to cell poly formation. This approach avoids thinning the field oxide in all peripheral isolation regions outside of the memory array. It also eliminates the need for the extra strip and regrow process steps. This invention does not require any etch into the silicon substrate. This avoids the possibility of crystal fault generation and propagation that could occur in the etch step or subsequent processing steps.

The LER process provides no added Silicon stress and thus no added associated junction leakage. The process is applicable to grounded or Vcc/2 field plate designs.

Major advantages of this invention over known prior art include: no added Si crystal stress at the isolation edges; simple process steps promoting good wafer yield; the invention can be performed with standard fabrication equipment and can be easily retrofitted into most DRAM process flows; boron implant improves the isolation integrity between cells.

Isolation region width reduction can be selected limited only by the electrical considerations of closely spaced N+ to N+ junctions. This limitation is much less than the encroachment aggravated photolithographic minimum of prior art schemes. Due to the isotropic nature of the wet HF etch, the resulting isolation oxide profile remains gentle, easing subsequent thin film photomasking and etch steps.

With the LER process, a strip and regrow of the initial oxide from the local oxidation oxide/nitride stack is not necessary. This is because the LER process can be added (though not mandatory) to the process flow after transistor formation and prior to cell poly formation. This approach avoids thinning the field oxide in isolation regions outside of the memory array. It also eliminates the need for the extra strip and regrow process steps. This embodiment does not require any etch into the Silicon substrate. This avoids the possibility of crystal fault generation and propagation that could occur in the etch step or subsequent processing steps.

DETAILED DESCRIPTION OF THE PREFERRED EMBODIMENT

This invention describes a technique to maximize cell capacitor area in a high density/high volume DRAM (dynamic random access memory) fabrication process in a sequence shown in FIGS. 1a–1f. In FIGS. 1, the left side shows a representative device in the periphery of a dynamic random access memory (DRAM) chip, and the right side shows a portion of a memory array of the DRAM.

Figure 1A:
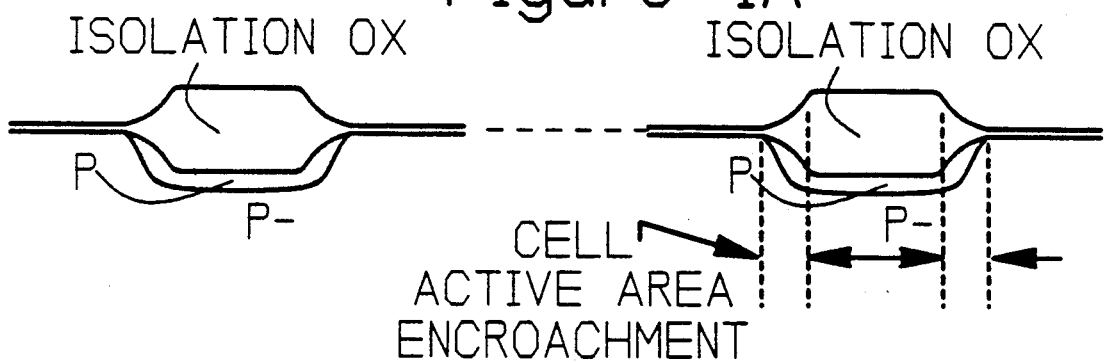
FIG. 1a shows a cross-section of a wafer during the fabrication of a semiconductor circuit device, in which active area is defined and the growth of field ox for isolation is completed.
Figure 1B:
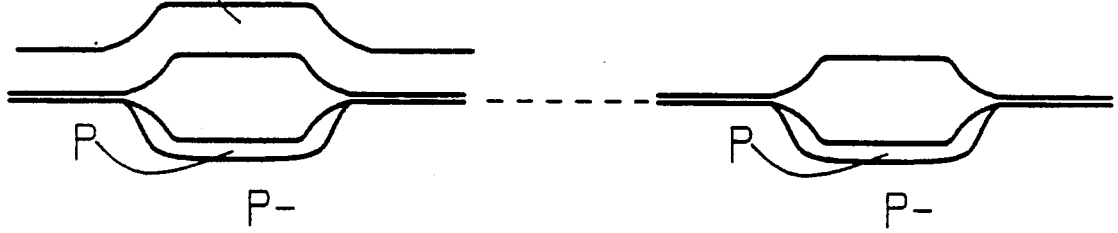
FIG. 1b shows the patterning of the LER mask into photoresist.
Figure 1C:
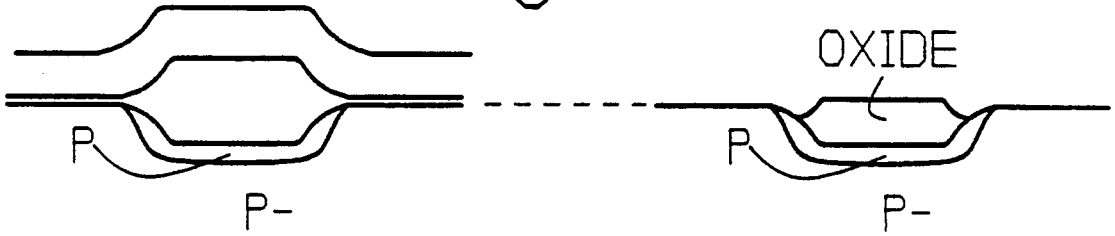
FIG. 1c shows a cross-section of a wafer which is oxide etched in order to reduce encroachment of silicon oxide into active cell area.
Figure 1D:
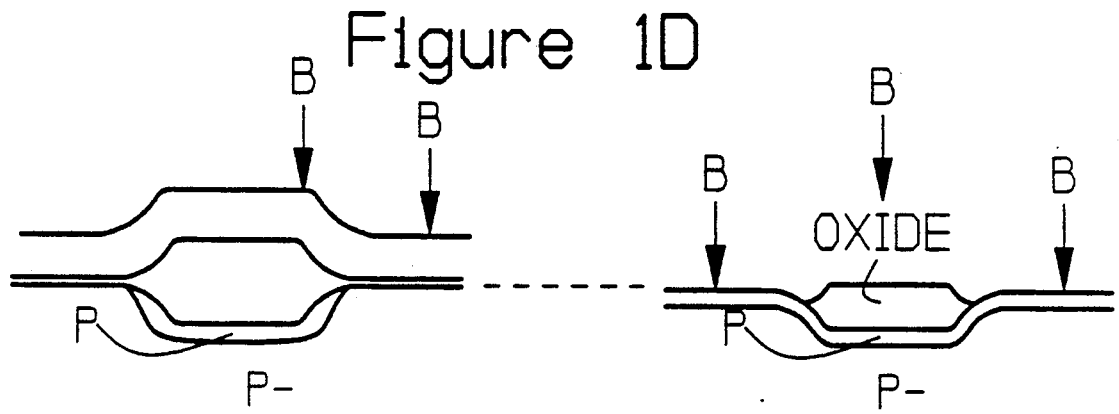
FIG. 1d shows the application of a high-energy boron implant.
Figure 1E:
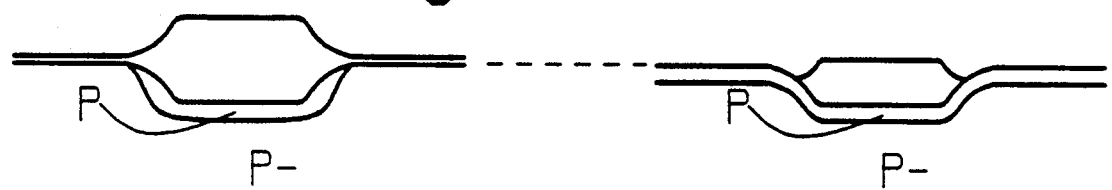
FIG. 1e shows the wafer cross-section after resist strip.
Figure 1F:
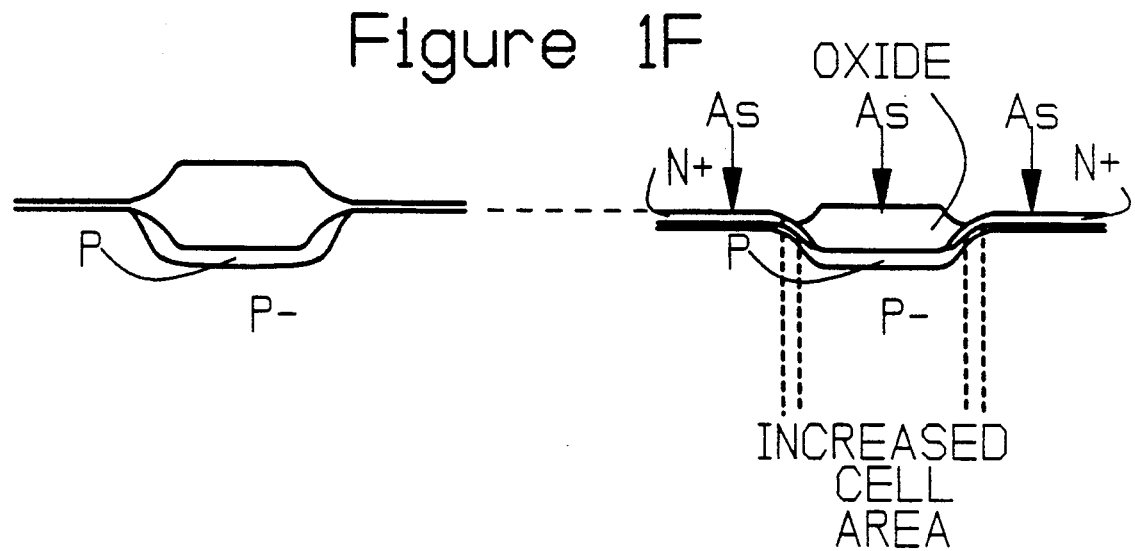
FIG. 1f shows the cross-section of the wafer at the point of N+ cell bottom plate implantation.
Figure 2:
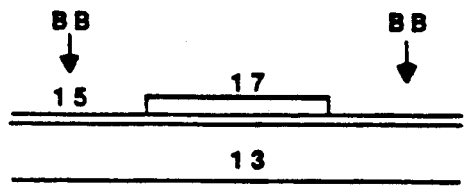
FIG. 2 shows a cross-section of a wafer during the fabrication of a semiconductor circuit device, in which active area is defined.

The "local encroachment reduction" (LER) process is added to the DRAM process flow just prior to an N-type bottom plate capacitor implant step. FIG. 2 shows a cross-section of a semiconductor circuit during its fabrication. A silicon wafer 13 is prepared by forming a thin film of oxide 15 and then depositing nitride 17 over the thin oxide 15. The nitride is masked and etched in order to define active area. The unmasked portions of the wafer 13 are then implanted with boron in order to form a field implant of P-type material.

Figure 3:
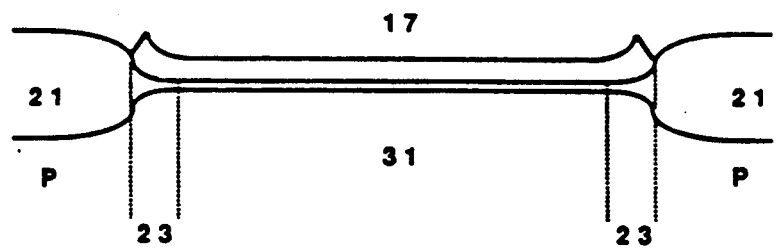
FIG. 3 shows the growth of field ox onto the wafer of FIG. 2.

After the field implant, a thick layer of silicon oxide 21 is grown onto the wafer 13 to form field ox, as shown in FIG. 3. The growth of silicon oxide occurs in areas which are not covered by the nitride mask 17, but tends to encroach on the active area, marked AA. The encroachment is present around the edges of the nitride 17, as indicated by dashed lines 23, where the oxide 21 begins to "buck up" or lift the nitride 17.

Figure 4:
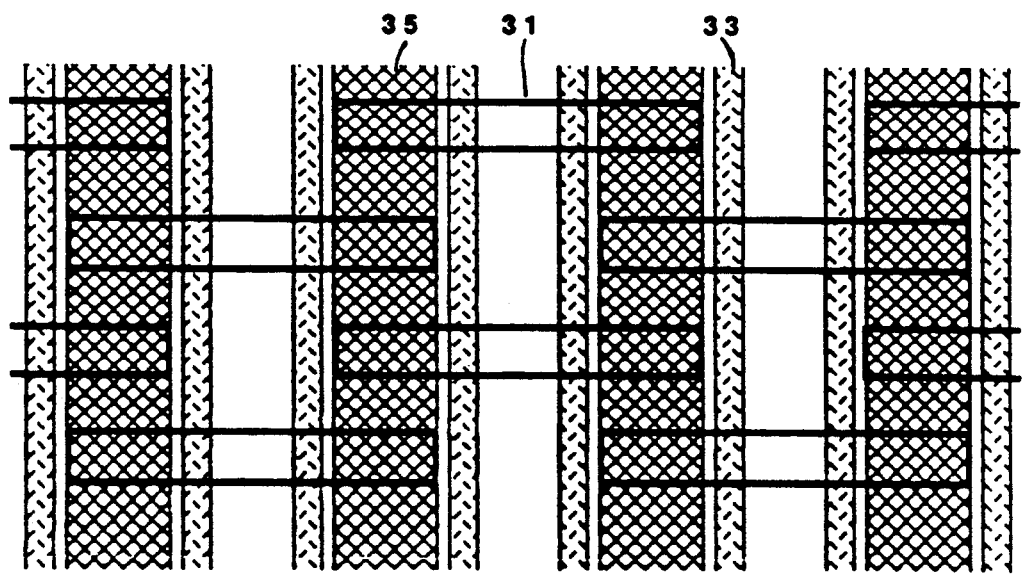
FIG. 4 shows a top view of one example of a repetitive cell layout on the wafer of FIG. 3.

FIG. 4 shows a top view of the wafer 13. The active area, marked 31, includes word lines 33 which coincide in location to access transistors (not separately shown) on the active areas 31. The wafer 13 is masked over the word lines 33 in order that the integrity of these word lines 33 not be affected by subsequent etching. This step, referred to as LER photomasking, defines the regions where the capacitor active area is to be 35. This photo level also defines all field ox isolation regions between cell capacitor active regions.

Figure 5:
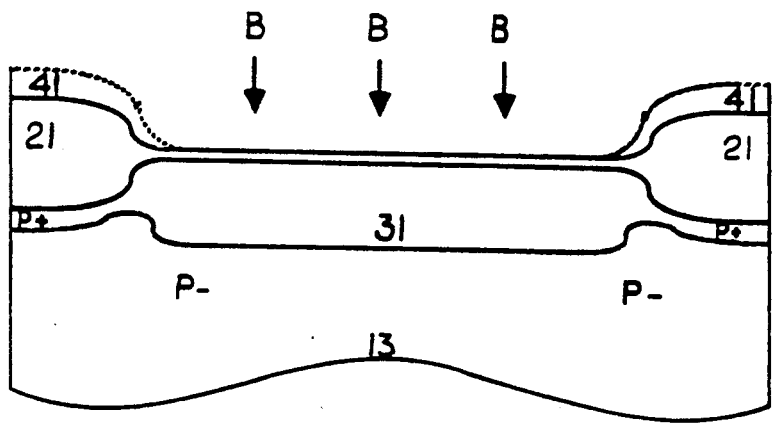
FIG. 5 shows a cross-section of a wafer which is dipped in order to reduce encroachment of silicon dioxide into active area.

After the LER photomasking, the wafer 13 is oxide etched in order to remove a top portion 41 of the field ox 21, as shown in FIG. 5. This reduces the encroachment of the silicon oxide 21 into the active area 31 by reducing the thickness of the field oxide 21 in the regions of encroachment.

This stripping of the top layer, referred to as dilute buffered hydrofluoric acid wet oxide etch, is timed to remove a pre-determined fraction of the field oxide. This wet oxide etch step also reduces the total thickness of the field oxide 21, but the masking of the word lines 33 prevents this top layer 41 from being stripped at the location of the word lines.

Prior to the dipping of the wafer to remove the top layer 41, the nitride mask 17 is stripped. Preferably, this is accomplished prior to the masking of the word lines 33.

The reduced thickness of the field oxide 21 adjacent to the active area 31 establishes an active MOS transistor device in the completed wafer. This active parasitic MOS transistor device could result in shunting between adjacent active areas 31.

An implant step, referred to as a "LER boron implant" step increases the threshold voltage (V) of these active Junction devices between active areas. In the LER boron implant step, a high energy boron implant is used to establish a higher concentration P-type region. The dose here is maximized but kept safely below the point of increasing junction leakage. The energy is optimized for penetration through the remaining field ox, while locating the active area peak distribution just below the junction depth of the subsequent N+ cell bottom plate formation. The high energy boron implant causes the boron to penetrate the oxide 21 and active area 31. Where the oxide 21 covers the wafer 13, the boron establishes a P-type region, shown in FIG. 6. The P-type region is directly below the field ox 21. In the active area, the boron penetrates deeply into the wafer 13. This becomes a high capacitance implant, which will extend beneath N+ material and raise the capacitance of active area capacitors.

Figure 6:
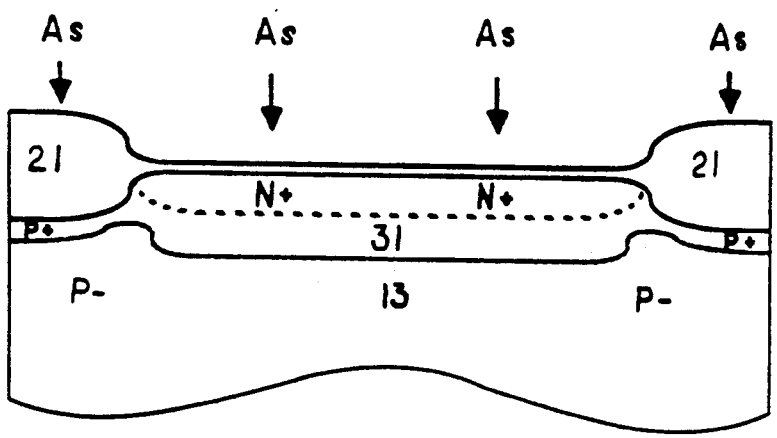
FIG. 6 shows the cross-section of the wafer of FIG. 5, with subsequent N+ cell bottom plate formation.

Subsequent to the high capacitance implant, the mask protecting the word lines 35 is stripped and an arsenic implant is applied throughout the wafer, as shown in FIG. 6. The arsenic implant results in n+ material extending beneath the active area, but not as deep as the high C implant. This becomes an N-type bottom plate capacitor implant. This implant can be masked or a blanket implant, depending on the application's specific process flow. In the preferred embodiment, the bottom plate capacitor implant is masked, but the bottom plate capacitor may be blanket applied (without a mask). The N-type bottom plate implant dose is high enough to significantly compensate the LER boron implant, thus insuring proper bottom plate junction formation. The arsenic does not penetrate the field ox 21.

Figure 7:
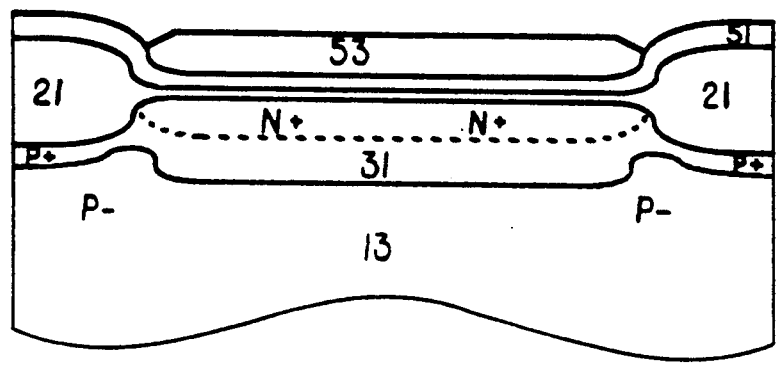
FIG. 7 shows the wafer of FIG. 6, with a dielectric layer formed over the active area and cell polysilicon formed over the dielectric layer.

Following the arsenic implant, a dielectric layer 51 is formed over the active area, and cell polysilicon 53 is formed over the dielectric layer 1. This results in the structure shown in FIG. 7.

While the invention is described in terms of DRAMs, this is merely the preferred embodiment for which the inventive techniques were developed. The local encroachment reduction process is also applicable to related semiconductor circuit devices, including video random access memories (VRAMs) and other multiport RAMS, and other semiconductor devices.

Clearly, other steps may be taken within the scope of the invention in order to accomplish either same or different circuit results. Accordingly, the invention should be read only as limited by the claims.

I claim:

1. Method of forming semiconductor circuit devices which include, as a part of each device, a plurality of cells and active circuit elements to control signals, the cells and active circuit elements forming a repeating pattern on the device, the method comprising:
   a) preparing a silicon wafer and establishing the wafer as a substrate;
   b) forming oxide on the wafer to define field oxide and active areas;
   c) photomasking to define regions of field isolation oxide to be reduced in thickness;
   d) etching said defined regions of field isolation oxide to be reduced in thickness to remove a fraction of field oxide present, wherein said fraction of oxide removed is greater than 50% of the field oxide thickness; and
   e) after defining the regions of field isolation oxide to be reduced in thickness and after said etching said defined regions of field isolation oxide, implanting the wafer with a boron implant wherein the boron is implanted with energy levels which are optimized for penetration through the field oxide remaining after said etching of said defined regions of field isolation oxide to be reduced in thickness, but kept safely below the point of increasing junction leakage, the optimization of the energy levels for the implantation of the wafer resulting from said boron implant, including locating the active area peak distribution just below a junction depth of subsequent N+ cell bottom plate formation, thereby enhancing isolation integrity between said cells, said implant also functioning as a cell high capacitance implant for increasing the unction capacitance and providing a barrier to minority substrate electrons.

2. Method of forming semiconductor devices as described in claim 1, further characterized by:
   implanting an N-type bottom plate capacitor implant at an implant does sufficient to significantly compensate the boron implant so as to ensure a bottom plate junction formation.

3. Method of forming semiconductor devices as described in claim 2, further characterized by:
   the N-type bottom plate capacitor implant being arsenic.

4. Method of forming semiconductor circuit memory devices which include, as a part of each device, a plurality of memory cells and active circuit elements to control signals, the cells and active circuit elements forming a repeating pattern on the device, the method comprising:
   a) preparing a silicon wafer and establishing the wafer as a substrate;
   b) forming oxide on the wafer to define field oxide and active areas;
   c) photomasking with photoresist to define local encroachment reduction regions where capacitor active area is to be, said photoresist defining field oxide isolation regions between cell capacitor active regions;
   d) applying an isotropic oxide etch, and timing said etch to remove a fraction of the field oxide by application of a wet oxide etch as said isotropic oxide etch to remove said pre-determined fraction, wherein said fraction of oxide removed is greater than 50% of the field oxide thickness;
   e) after defining the regions of field isolation oxide to be reduced in thickness and after said etching said defined regions of field isolation oxide, implanting the wafer with boron at an implantation dose which is optimized, below a point of increasing junction leakage, for penetration through the remaining field oxide, while locating the active area peak distribution just below a junction depth of a subsequent N+ cell bottom plate formation, said implant subsequent to said applying an isotropic oxide etch resulting in an increase in junction capacitance and providing a barrier to minority substrate electrons;
   f) removing said photoresist; and
   g) implanting an N-type bottom plate capacitor implant at an implant dose sufficient to significantly compensate the boron implant so as to ensure a bottom plate junction formation.

5. Method of forming semiconductor memory devices as described in claim 4, further characterized by:
using dilute buffered hydrofluoric acid wet oxide etch as said oxide etch.

6. Method of forming semiconductor memory devices as described in claim 4, further characterized by:
the N-type bottom plate capacitor implanted by blanket application.

7. Method of forming semiconductor memory devices as described in claim 4, further characterized by:
a) masking the wafer subsequent said removal of said photoresist, in order to apply photoresist for defining said N-type bottom plate capacitors; and
b) the N-type bottom plate capacitor implanted into regions defined by said photoresist.

8. Method of forming semiconductor memory devices as described in claim 4, further characterized by:
said implanting the wafer with boron at an implantation dose being performed subsequent to transistor formation and prior to cell poly formation.

9. Method of forming semiconductor memory devices as described in claim 4, further characterized by:
said fraction of oxide removed being determined by considerations of leakage from closely spaced N+ to N+ junctions.

10. Method of forming semiconductor memory devices as described in claim 4, further characterized by:
said implanting the wafer with boron at an implantation dose being performed subsequent to transistor formation and prior to cell poly formation.

11. Method of forming semiconductor memory devices as described in claim 4, further characterized by:
forming each of said semiconductor memory devices with a Vcc/2 field plate.

12. Method of forming semiconductor memory devices as described in claim 4, further characterized by:
forming each of said semiconductor memory devices with a grounded field plate.

13. Method of forming semiconductor circuit memory devices which include, as a part of each device, a plurality of memory cells and active circuit elements to control signals, the cells and active circuit elements forming a repeating pattern on the device, the method comprising:
a) preparing a silicon wafer and establishing the wafer as a substrate;
b) forming oxide on the wafer to define field oxide and active areas;
c) photomasking with photoresist to define local encroachment reduction regions where capacitor active area is to be, said photoresist defining field oxide isolation regions between cell capacitor active regions;
d) applying an oxide etch, and timing said etch to remove a fraction of the field oxide, wherein said fraction of oxide removed is greater than 50% of the field oxide thickness;
e) after defining the regions of field isolation oxide to be reduced in thickness and after said etching said defined regions of field isolation oxide, implanting the wafer with a boron at an implantation dose which is optimized, below a point of increasing junction leakage, for penetration through the remaining field oxide, while locating the active area peak distribution just below a junction depth of a subsequent N+ cell bottom plate formation, said implant subsequent to said applying said oxide etch resulting in an increase in junction capacitance and providing a barrier to minority substrate electrons;
f) removing said photoresist; and
g) implanting, in a blanket implant step, an N-type bottom plate capacitor implant at an implant dose sufficient to significantly compensate the boron implant so as to ensure a bottom plate junction formation.

14. Method of forming semiconductor memory devices as described in claim 13, further characterized by:
said implanting the wafer with boron at an implantation dose being performed subsequent to transistor formation and prior to cell poly formation.

15. Method of forming semiconductor memory devices as described in claim 13, further characterized by:
said fraction of oxide removed being determined by considerations of leakage from closely spaced N+ to N+ junctions.

16. Method of forming semiconductor circuit memory devices which include, as a part of each device, a plurality of memory cells and active circuit elements to control signals, the cells and active circuit elements forming a repeating pattern on the device, the method comprising:
a) preparing a silicon wafer and establishing the wafer as a substrate;
b) forming oxide on the wafer to define field oxide and active areas;
c) photomasking with photoresist to define local encroachment reduction regions where capacitor active area is to be, said photoresist defining field oxide isolation regions between cell capacitor active regions;
d) applying an oxide etch, and timing said etch to remove a fraction of the field oxide, wherein said fraction of oxide removed is greater than 50% of the field oxide thickness;
e) after defining the regions of field isolation oxide to be reduced in thickness and after said etching said defined regions of field isolation oxide, implanting the wafer with a boron at an implantation dose which is optimized, below a point of increasing junction leakage, for penetration through the remaining field oxide, while locating the active area peak distribution just below a junction depth of a subsequent N+ cell bottom plate formation, said implant subsequent to said applying said oxide etch resulting in an increase in junction capacitance and providing a barrier to minority substrate electrons;
f) removing said photoresist;
g) masking the wafer subsequent said removal of said photoresist, in order to apply photoresist for defining said N-type bottom plate capacitors; and
h) implanting an N-type bottom plate capacitor implant at an implant dose sufficient to significantly compensate the boron implant so as to ensure a bottom plate junction formation, the N-type bottom plate capacitor implanted into regions defined by said photoresist.

17. Method of forming semiconductor memory devices as described in claim 16, further characterized by:
said fraction of oxide removed being determined by considerations of leakage from closely spaced N+ to N+ junctions.

18. Method of forming semiconductor memory devices as described in claim 16, further characterized by:

said implanting the wafer with boron at an implantation dose being performed subsequent to transistor formation and prior to cell poly formation.

19. Method of forming semiconductor circuit memory devices which include, as a part of each device, a plurality of memory cells and active circuit elements to control signals, the cells and active circuit elements forming a repeating pattern on the device, the method comprising:
   a) preparing a silicon wafer and establishing the wafer as a substrate;
   b) forming oxide on the wafer to define field oxide and active areas;
   c) photomasking with photoresist to define local encroachment reduction regions where capacitor active area is to be, said photoresist defining field oxide isolation regions between cell capacitor active regions;
   d) applying an oxide etch, and timing said etch to remove a fraction of the field oxide, said fraction of oxide removed is greater than 50% of the field oxide thickness, but kept safely below the point of increasing junction leakage, and said fraction of oxide removed being determined by considerations of leakage from closely spaced N+ to N+ junctions;
   e) after defining the regions of field isolation oxide to be reduced in thickness and after said etching said defined regions of field isolation oxide, implanting the wafer with a boron at an implantation dose which is optimized, below a point of increasing junction leakage, for penetration through the remaining field oxide, while locating the active area peak distribution just below a junction depth of a subsequent N+ cell bottom plate formation, said implant subsequent to said applying said oxide etch resulting in an increase in junction capacitance and providing a barrier to minority substrate electrons;
   f) removing said photoresist;
   g) implanting an N-type bottom plate capacitor implant at an implant dose sufficient to significantly compensate the boron implant so as to ensure a bottom plate junction formation.

20. Method of forming semiconductor memory devices as described in claim 19, further characterized by:
said implanting the wafer with boron at an implantation dose being performed subsequent to transistor formation and prior to cell poly formation.

* * * * *